United States Patent
Kim

(10) Patent No.: US 8,563,427 B2
(45) Date of Patent: Oct. 22, 2013

(54) SEMICONDUCTOR CHIP WITH CONDUCTIVE DIFFUSION REGIONS, METHOD FOR MANUFACTURING THE SAME, AND STACK PACKAGE USING THE SAME

(75) Inventor: Sung Min Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 225 days.

(21) Appl. No.: 12/981,207

(22) Filed: Dec. 29, 2010

(65) Prior Publication Data

US 2011/0309509 A1 Dec. 22, 2011

(30) Foreign Application Priority Data

Jun. 17, 2010 (KR) .................. 10-2010-0057511

(51) Int. Cl.
*H01L 25/07* (2006.01)

(52) U.S. Cl.
USPC ........... 438/643; 438/637; 438/667; 438/622; 438/618; 438/459; 257/774; 257/751; 257/E23.141

(58) Field of Classification Search
USPC .......... 257/751, E23.141, 774; 438/648, 643, 438/637, 667, 622, 618, 459, 455
See application file for complete search history.

(56) References Cited

U.S. PATENT DOCUMENTS

| 7,592,656 B2 * | 9/2009 | Kikuchi et al. | 257/295 |
| 7,888,255 B2 * | 2/2011 | Gibbons et al. | 438/600 |
| 8,097,956 B2 * | 1/2012 | von Kaenel | 257/777 |
| 2011/0241217 A1 * | 10/2011 | Chang et al. | 257/774 |

FOREIGN PATENT DOCUMENTS

| KR | 1020060020822 A | 3/2006 |
| KR | 1020070008834 A | 1/2007 |

* cited by examiner

*Primary Examiner* — S. V. Clark
*Assistant Examiner* — Krista Soderholm
(74) *Attorney, Agent, or Firm* — William Park & Associates Patent Ltd.

(57) ABSTRACT

A semiconductor chip includes a substrate with a barrier region and a conductive diffusion region formed in the substrate and is surrounded by the barrier region. The conductive diffusion region may provide a conductive oath from top of the substrate to bottom of the substrate.

15 Claims, 6 Drawing Sheets

SEMICONDUCTOR CHIP WITH CONDUCTIVE DIFFUSION REGIONS, METHOD FOR MANUFACTURING THE SAME, AND STACK PACKAGE USING THE SAME

CROSS-REFERENCE TO RELATED APPLICATIONS

The present application claims priority to Korean patent application number 10-2010-0057511 filed on Jun. 17, 2010, which is incorporated herein by reference in its entirety.

BACKGROUND OF THE INVENTION

The present invention relates to a semiconductor chip, a method for manufacturing the same, and a stack package using the same, and more particularly, to a semiconductor chip with conductive diffusions regions, a method for manufacturing the same, and a stack package using the same.

In the semiconductor industry, packaging technologies for semiconductor integrated circuits have continuously been developed to meet the demands toward miniaturization and mounting efficiency. Recently, various stacking techniques have been developed. The term "stack" in the semiconductor industry means to vertically place at least two semiconductor chips or semiconductor packages. By using the stacking techniques, it is possible to realize a product having memory capacity at least two times greater than that obtainable through semiconductor integration processes, and mounting area utilization efficiency can be elevated.

In a conventional stack package, through vias may be used to electrically connect one chip to another in the stack. The through vias are formed in such a manner that via holes are defined by etching respective semiconductor chips and a barrier layer and a conductive layer are filled in the via holes.

However, in conventional art, a dry reactive ion etching (DRIE) process may be used to form the via holes in the respective semiconductor chips. Due to this fact, since a separate DRIE equipment for conducting the DRIE process is needed, additional manufacturing processes and costs are required. Additionally, the DRIE process may affect the structure of the semiconductor chip that may lead to failures in the chip.

Also, in the conventional art mentioned above, a number of other equipments, such as a CVD (chemical vapor deposition) equipment for depositing an insulation material in the via holes, a PVD (physical vapor deposition) equipment for forming the barrier layer, a plating equipment for filling the via holes with a conductive material, and so on, may also be needed. As a consequence, in the conventional art, a number of additional equipments may be needed and a lot of costs are incurred to form the through vias in the semiconductor chips, but also a lengthy period may be required to conduct various processes with the respective equipments.

BRIEF SUMMARY OF THE INVENTION

Embodiments of the present invention are directed to a semiconductor chip with conductive diffusion regions, a method for manufacturing the same, and a stack package using the same.

Also, an embodiment of the present invention is directed to a semiconductor chip which can shorten a manufacturing time, a method for manufacturing the same, and a stack package using the same.

In one embodiment of the present invention, a semiconductor chip includes: a substrate having a top surface and a bottom surface; a barrier region that is formed in the substrate; and a conductive diffusion region that is formed in the substrate and is surrounded by the barrier region.

The conductive diffusion region may be formed to pass from the top surface to the bottom surface of the substrate.

The conductive diffusion region may be a region that is formed as a metal ingredient is diffused into a portion of the substrate that is surrounded by the barrier region.

The metal ingredient may be such material as, for example, copper, another metal, or an alloy.

The conductive diffusion region may be formed such that the metal ingredient has a concentration of approximately 10% to approximately 40% in the portion of the substrate that is surrounded by the barrier region.

The semiconductor chip may further include a metal layer pattern formed over the conductive diffusion region.

The substrate, which is formed with the conductive diffusion region and the barrier region, may include a circuit section and a scribe lane section that surrounds the circuit section.

The conductive diffusion region and the barrier region may be formed in the circuit section of the substrate and/or in the scribe lane section of the substrate.

In another embodiment of the present invention, a method for manufacturing a semiconductor chip includes forming a barrier region in a substrate that has a top surface and a bottom surface. A conductive diffusion region may be formed in the substrate in such a way as to be surrounded by the barrier region.

After forming the conductive diffusion region, the method may further include removing portions of the bottom surface of the substrate until the conductive diffusion region is exposed such that the conductive diffusion region may pass from the top surface to the bottom surface of the substrate.

The conductive diffusion region may be formed by diffusing a metal ingredient into a portion of the substrate that is surrounded by the barrier region.

The metal ingredient may be a material such as, for example, copper or copper alloy.

The conductive diffusion region may be formed such that the metal ingredient has a concentration of approximately 10% to approximately 40% in the portion of the substrate that is surrounded by the barrier region.

Forming the conductive diffusion region may comprise forming a metal layer pattern over the portion of the substrate that is surrounded by the barrier region, and diffusing a metal ingredient of the metal layer pattern into the portion of the substrate that is under the metal layer pattern.

The diffusing of the metal ingredient of the metal layer pattern may be implemented through annealing.

After the forming of the conductive diffusion region, the method may further include forming a metal layer pattern over the conductive diffusion region.

The substrate, which is formed with the conductive diffusion region and the barrier region, may include a circuit section and a scribe lane section that surrounds the circuit section.

The conductive diffusion region and the barrier region may be formed in the circuit section of the substrate and/or in the scribe lane section of the substrate.

In another embodiment of the present invention, a stack package may include a plurality of semiconductor chips each having a substrate, a barrier region that is formed in the substrate, and a conductive diffusion region that is formed in the substrate and is surrounded by the barrier region, wherein the semiconductor chips are stacked such that conductive diffusion regions of the plurality of semiconductor chips are electrically connected with one another.

Each of the plurality of semiconductor chips may further include a metal layer pattern formed over the conductive diffusion region.

DESCRIPTION OF SPECIFIC EMBODIMENTS

In various embodiments of the present invention, it is possible to form electrodes that pass through a semiconductor chip, without defining via holes that may require a DRIE (dry reactive ion etching) process. Therefore, in various embodiments of the present invention, since a separate DRIE equipment for conducting the DRIE process is not needed, the manufacturing cost can be reduced, and manufacturing processes can be simplified due to omission of the DRIE process.

In addition, in various embodiments of the present invention, due to the fact that the electrodes which pass through the semiconductor chip are formed through diffusing a copper ingredient into a substrate in place of filling a conductive material in via holes, a number of equipments for depositing an insulation material in the via holes, forming a barrier layer and filling a conductive material are not needed. Accordingly, in the embodiments of the present invention, the manufacturing costs can be reduced in the manufacture of the semiconductor chip, manufacturing processes can be simplified, and a manufacturing period can be shortened.

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
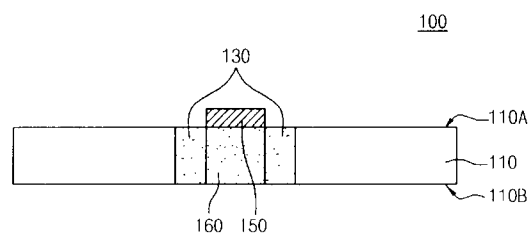
FIG. 1 is a cross-sectional view illustrating a semiconductor chip in accordance with an embodiment of the present invention.

FIG. 1 is a cross-sectional view illustrating a semiconductor chip in accordance with an embodiment of the present invention.

Referring to FIG. 1, a barrier region 130 is formed in a substrate 110 which has a top surface 110A and a bottom surface 110B. The barrier region 130 may have the shape of an annular or quadrangular frame when viewed from the top. The barrier region 130 may be formed of a material capable of preventing the diffusion of a metal ingredient such as, for example, Ti, TiN, Ta, TaN, TiW, NiB or a material containing at least one of these materials. The barrier region 130 may be formed as a selected material is doped into the substrate 110.

A conductive diffusion region 160 is formed in the substrate 110 in such a way as to be surrounded by the barrier region 130. The conductive diffusion region 160 is formed to pass from the one surface 110A to the other surface 110B of the substrate 110. The conductive diffusion region 160 is formed such that the side surface of the conductive diffusion region 160 is surrounded by the barrier region 130.

The conductive diffusion region 160 is a region that is formed using, for example, a metal ingredient having a relatively low specific resistance and excellent diffusability such as, for example, copper or copper alloy that is diffused into the substrate 110. The conductive diffusion region 160 is formed such that the metal ingredient has a concentration capable of allowing electrical connections to be formed between semiconductor chips 100 of a stack package, in the portion of the substrate 110 surrounded by the barrier region 130. The concentration of the metal ingredient in the conductive diffusion region 160 may have, for example, a concentration of approximately 10% to approximately 40%.

A metal layer pattern 150 is formed on the conductive diffusion region 160. The metal layer pattern 150 includes, for example, a copper layer or a copper alloy layer. The metal layer pattern 150 functions to ensure that a metal ingredient contained in the metal layer pattern 150 is diffused and the conductive diffusion region 160 is stably formed, and that the respective semiconductor chips 100 are stably connected with one another when stacking the semiconductor chips 100.

The substrate 110, which is formed with the conductive diffusion region 160 and the barrier region 130, includes a circuit section (not shown) and a scribe lane section (not shown) that surrounds the circuit section. The conductive diffusion region 160 and the barrier region 130 may be formed in the circuit section of the substrate 110 and/or in the scribe lane section of the substrate 110.

The semiconductor chip 100 in accordance with an embodiment of the present invention may include the conductive diffusion region 160 that is formed to pass from the top surface 110A to the bottom surface 110B of the substrate 110, without the need of defining a via hole. Therefore, in an embodiment of the present invention, the semiconductor chip 100 having the conductive diffusion region 160 that passes from the top surface 110A to the bottom surface 110B of the substrate 110 can be realized without the need for processes, equipments, costs and time necessary for defining the via hole and depositing a conductive material in the via hole.

FIGS. 2A through 2D are cross-sectional views illustrating the processes of a method for manufacturing a semiconductor chip in accordance with another embodiment of the present invention.

Figure 2A:
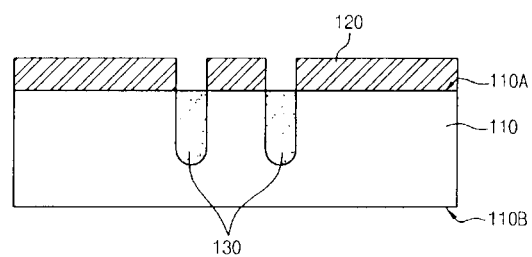
FIGS. 2A through 2D are cross-sectional views illustrating the processes of a method for manufacturing a semiconductor chip in accordance with another embodiment of the present invention.

Referring to FIG. 2A, a substrate 110 which has one surface 110A and the other surface 110B facing away from the one surface 110A is prepared. A photoresist is formed on the one surface 110A of the substrate 110. By patterning the photoresist, a first mask pattern 120 is formed to expose a portion of the one surface 110A of the substrate 110. The portion of the one surface 110A of the substrate 110 which is exposed through the first mask pattern 120 has the shape of an annular or quadrangular frame when viewed from the top.

A barrier region 130 is formed in the portion of the substrate 110 that is exposed through the first mask pattern 120. The barrier region 130 may be formed, for example, by doping a material capable of preventing diffusion of a metal ingredient. The doping material may be any one of materials such as, for example, Ti, TiN, Ta, TaN, TiW, NiB or a material containing at least one of these materials. The barrier region 130 may have the shape of an annular or quadrangular frame when viewed from the top.

The substrate 110 may include a circuit section (not shown) and a scribe lane section (not shown) that surrounds the circuit section. The barrier region 130 may be formed in the circuit section of the substrate 110 and/or in the scribe lane section of the substrate 110.

Figure 2B:
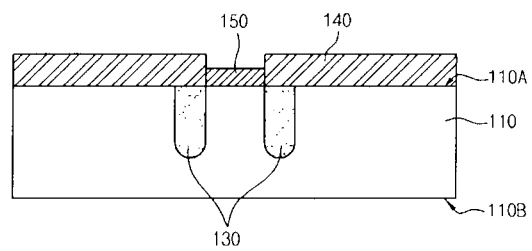

Referring to FIG. 2B, the first mask pattern 120 is removed. By forming a photoresist (not shown) on the top surface 110A of the substrate 110, which is formed with the barrier region 130, and patterning the photoresist, a second mask pattern 140 is formed in such a way as to expose a portion of the top surface 110A of the substrate 110 that is surrounded by the barrier region 130. A metal layer pattern 150 is formed on the another portion of the top surface 110A of the substrate 110 that is exposed through the second mask pattern 140.

The metal layer pattern 150 is formed as a metal layer having a relatively low specific resistance and excellent diffusability, for example, as a copper layer or a copper alloy layer. The metal layer pattern 150 can be formed through electroplating by using a seed layer (not shown) or may be formed through various methods such as CVD or PVD. In the case of forming the metal layer pattern 150 through electroplating, the seed layer may be formed of a material that does not prevent diffusion of the metal ingredient of the metal layer pattern 150 and provides adequate adhesion force between the substrate 110 and the metal layer pattern 150.

Figure 2C:
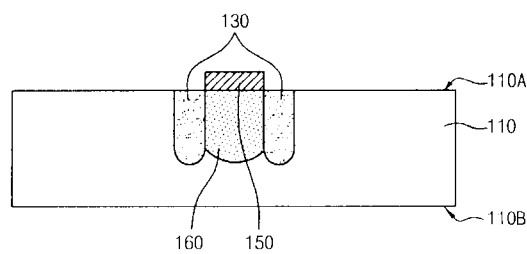

Referring to FIG. 2C, the second mask pattern 140 is removed. By diffusing a metal ingredient such as, for example, copper, other metal, or an alloy, in the metal layer pattern 150, into a portion of the substrate 110 under the metal layer pattern 150, a conductive diffusion region 160 may be formed in the substrate 110 in such a manner that the side surface of the conductive diffusion region 160 is surrounded by the barrier region 130 which has the shape of an annular or quadrangular frame. The barrier region 130 may have the other shape instead of the shape of an annular or quadrangular frame.

The diffusion of the metal ingredient may be implemented through annealing. In the case where the barrier region 130 and the conductive diffusion region 160 are formed in the circuit section of the substrate 110, the annealing may be conducted at a temperature that does not adversely affect the circuit section of the substrate 110 while allowing the diffusion of the metal ingredient to occur appropriately. The conductive diffusion region 160 may be formed such that the metal ingredient has a concentration capable of allowing electrical connections to be formed between semiconductor chips 100 of a stack package in the portion of the substrate 110 surrounded by the barrier region 130. The metal ingredient may have a concentration of, for example, approximately 10% to approximately 40%.

Figure 2D:
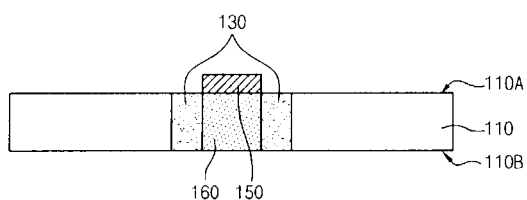

Referring to FIG. 2D, a bottom portion of the substrate 110 is removed until the barrier region 130 and the conductive diffusion region 160 are exposed. As a consequence, the conductive diffusion region 160 may pass from the top surface 110A to the bottom surface 110B of the substrate 110. As the substrate 110 is removed in part on the bottom surface 110B, the thickness of the substrate 110 including the conductive diffusion region 160 is reduced, whereby the resistance value of the conductive diffusion region 160 decreases.

In the above-described embodiment of the present invention, as a metal ingredient having a relatively low specific resistance and excellent diffusability is diffused into a substrate, a conductive diffusion region, which passes from one surface to the other surface of the substrate, can be formed without defining a via hole by physically perforating the substrate.

Accordingly, in an embodiment of the present invention, a DRIE process for defining the via hole, and various processes and equipments for forming an insulation layer and a barrier layer in the via hole and filling a conductive material in the via hole are not needed. Therefore, in the embodiment of the present invention, manufacturing processes, times and costs can be saved when manufacturing a semiconductor chip including the conductive diffusion region.

While it was described in the above embodiment that the conductive diffusion region is formed through forming the metal layer pattern on the portion of the substrate surrounded by the barrier region and diffusing the metal ingredient of the metal layer pattern into the substrate, it is conceivable in another embodiment of the present invention that a conductive diffusion region can be formed through diffusing a metal ingredient into a substrate without using a metal layer pattern.

FIGS. 3A through 3D are cross-sectional views illustrating the processes of a method for manufacturing a semiconductor chip in accordance with another embodiment of the present invention.

Figure 3A:
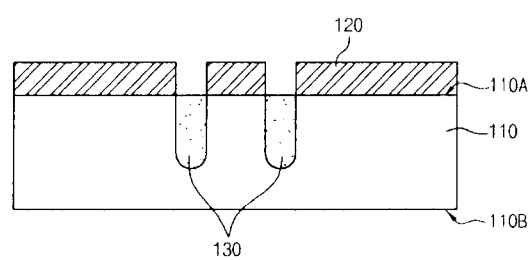
FIGS. 3A through 3D are cross-sectional views illustrating the processes of a method for manufacturing a semiconductor chip in accordance with another embodiment of the present invention.

Referring to FIG. 3A, there is shown the substrate 110 that has the top surface 110A and the bottom surface 110B. A photoresist (not shown) is formed on the top surface 110A of the substrate 110. By patterning the photoresist, a first mask pattern 120 is formed to expose a portion of the top surface 110A of the substrate 110. The portion of the top surface 110A of the substrate 110 that is exposed through the first mask pattern 120 may have the shape of an annular or quadrangular frame when viewed from the top.

A barrier region 130 may be formed in the portion of the top surface 110A of the substrate 110 that is exposed through the first mask pattern 120 by doping a material capable of preventing diffusion of a metal ingredient. Such a doping material may be, for example, any one of materials including Ti, TiN, Ta, TaN, TiW, NiB, or a material containing at least one of these materials. The barrier region 130 may have the shape of an annular or quadrangular frame when viewed from the top.

The substrate 110 may include a circuit section (not shown) and a scribe lane section (not shown) that surrounds the circuit section. The barrier region 130 may be formed in the circuit section of the substrate 110 and/or in the scribe lane section of the substrate 110.

Figure 3B:
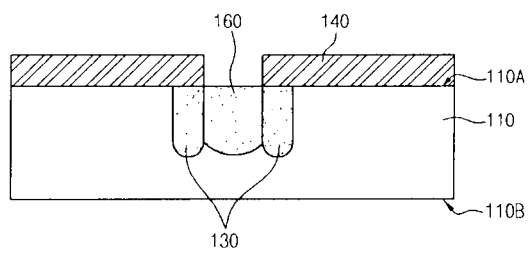

Referring to FIG. 3B, the first mask pattern 120 is removed. By forming a photoresist (not shown) on the top surface 110A of the substrate 110, which is formed with the barrier region 130, and patterning the photoresist, a second mask pattern 140 may be formed in such a way as to expose another portion of the top surface 110A of the substrate 110.

By diffusing a metal ingredient into the exposed portion of the top surface 110A of the substrate 110, a conductive diffusion region 160 may be formed in the substrate 110 in such a manner that the side surface of the conductive diffusion region 160 is surrounded by the barrier region 130 which has the shape of an annular or quadrangular frame. The conductive diffusion region 160 is formed by diffusing a metal ingredient having a relatively low specific resistance and excellent diffusability, for example, copper or copper alloy. The diffusion of the metal ingredient may be conducted through various methods such as, for example, doping, ion implantation and sputtering. The diffusion of the copper ingredient may be conducted in a high temperature condition so that the diffusion effect of the copper ingredient can be increased.

In the case where the barrier region 130 and the conductive diffusion region 160 are formed in the circuit section of the substrate 110, the diffusion of the metal ingredient may be conducted at a temperature that does not influence the circuit section of the substrate 110 while allowing the diffusion of the metal ingredient to occur appropriately. The conductive diffusion region 160 may be formed such that the metal ingredient has a concentration that is capable of allowing electrical connections to be formed between semiconductor chips 100 of a stack package in the portion of the substrate 110 surrounded by the barrier region 130. The metal ingredient concentration may be, for example, from approximately 10% to 40%.

Figure 3C:
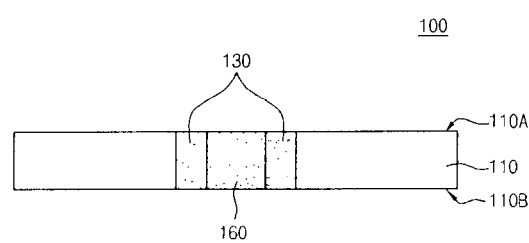

Referring to FIG. 3C, the second mask pattern 140 is removed. Portions of the bottom surface 110B may be removed until the barrier region 130 and the conductive diffusion region 160 are exposed. As a consequence, the conductive diffusion region 160 is formed to pass from the top surface 110A to the bottom surface 110B of the substrate 110. As the substrate 110 is removed in part on the second surface 110B, the thickness of the substrate 110 including the conductive diffusion region 160 is reduced, whereby the resistance value of the conductive diffusion region 160 decreases.

Figure 3D:
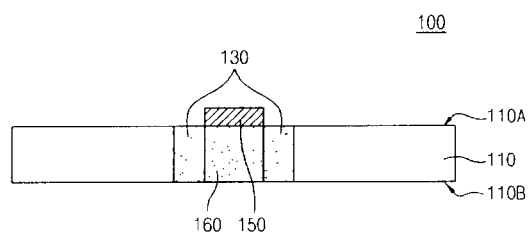

Referring to FIG. 3D, a metal layer pattern 150 is formed on the conductive diffusion region 160. The metal layer pattern 150 may be, for example, a copper layer or a copper alloy layer. The metal layer pattern 150 functions to ensure that connections between respective semiconductor chips 100 are stably formed when stacking the semiconductor chips 100. The metal layer pattern 150 may be formed before removing the second mask pattern 140 in the state in which the conductive diffusion region 160 is formed.

Figure 4:
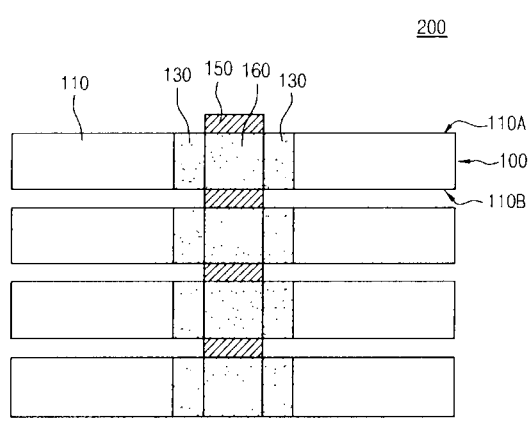
FIG. 4 is a cross-sectional view illustrating a stack package in accordance with another embodiment of the present invention.

FIG. 4 is a cross-sectional view illustrating a stack package in accordance with another embodiment of the present invention.

Referring to FIG. 4, at least two semiconductor chips 100, each including a substrate 110 that has the top surface 110A and the bottom surface 110B, the barrier region 130 formed in the substrate 110, and the conductive diffusion region 160 formed in the substrate 110 and surrounded by the barrier region 130, are stacked.

The semiconductor chips 100 are stacked in such a manner that their conductive diffusion regions 160 are electrically connected with one another. Each of the semiconductor chips 100 further includes a metal layer pattern 150 which is formed on the conductive diffusion region 160. The metal layer pattern 150 may comprise, for example, a copper layer or a copper alloy layer. The respective semiconductor chips 100 are electrically connected with one another through metal layer patterns 150 and conductive diffusion regions 160.

While not shown in a drawing, in order to electrically connect the semiconductor chips 100, other connection members may be formed instead of the metal layer patterns 150 or other connection members may be formed over the metal layer patterns 150. For example, the conductive diffusion regions 160 may protrude above the top surface 110A. Various embodiments of the invention may also enable stacking semiconductor chips that have no metal layer pattern 150 or other protrusions above the top surface 110A Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor chip, comprising:
    forming a barrier region in a substrate having a top surface and a bottom surface, wherein the barrier region is exposed to the top surface, extending from the top surface to the inside of the substrate;
    forming a conductive diffusion region by diffusing a metal ingredient into a portion of the substrate which is surrounded by the barrier region, wherein the conductive diffusion region is exposed to the top surface, and extending from the top surface to the inside of the substrate; and
    removing portions of the bottom surface of the substrate to expose the conductive diffusion region.

2. The method according to claim 1, wherein the metal ingredient is one of: copper and copper alloy.

3. The method according to claim 1, wherein forming the conductive diffusion region is implemented such that the metal ingredient has a concentration of substantially 10% to substantially 40% in the portion of the substrate that is surrounded by the barrier region.

4. The method according to claim 1, wherein forming the conductive diffusion region comprises:
    forming a metal layer pattern over the portion of the substrate that is surrounded by the barrier region; and
    diffusing a metal ingredient of the metal layer pattern into the portion of the substrate which is placed under the metal layer pattern.

5. The method according to claim 4, wherein the metal ingredient is diffused through annealing.

6. The method according to claim 1, further comprising:
    forming a metal layer pattern over the conductive diffusion region.

7. The method according to claim 1, wherein the substrate comprises a circuit section and a scribe lane section that surrounds the circuit section.

8. The method according to claim 7, wherein the conductive diffusion region and the barrier region are formed at least in one of: the circuit section of the substrate and in the scribe lane section of the substrate.

9. A method for manufacturing a semiconductor chip, comprising:
    forming a barrier region in a substrate having a top surface and a bottom surface; and
    forming a conductive diffusion region surrounded by the barrier region,
    wherein forming the conductive diffusion region comprises:
    forming a metal layer pattern over the portion of the substrate that is surrounded by the barrier region; and
    diffusing a metal ingredient of the metal layer pattern into the portion of the substrate which is placed under the metal layer pattern.

10. The method according to claim 9, further comprising:
    removing portions of the bottom surface of the substrate to expose the conductive diffusion region.

11. The method according to claim 9, wherein the metal ingredient is one of: copper and copper alloy.

12. The method according to claim 9, wherein forming the conductive diffusion region is implemented such that the metal ingredient has a concentration of substantially 10% to substantially 40% in the portion of the substrate that is surrounded by the barrier region.

13. The method according to claim 9, wherein the metal ingredient is diffused through annealing.

14. The method according to claim 9, wherein the substrate comprises a circuit section and a scribe lane section that surrounds the circuit section.

15. The method according to claim 14, wherein the conductive diffusion region and the barrier region are formed at least in one of: the circuit section of the substrate and in the scribe lane section of the substrate.

* * * * *